(12) United States Patent
Landwehr et al.

(10) Patent No.: US 10,329,205 B2
(45) Date of Patent: Jun. 25, 2019

(54) BOND LAYER FOR SILICON-CONTAINING SUBSTRATES

(71) Applicant: Rolls-Royce Corporation, Indianapolis, IN (US)

(72) Inventors: Sean E. Landwehr, Avon, IN (US); Kang N. Lee, Zionsville, IN (US); Adam Lee Chamberlain, Mooresville, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 632 days.

(21) Appl. No.: 14/947,870

(22) Filed: Nov. 20, 2015

(65) Prior Publication Data

US 2016/0145159 A1 May 26, 2016

Related U.S. Application Data

(60) Provisional application No. 62/083,742, filed on Nov. 24, 2014.

(51) Int. Cl.
*C04B 41/50* (2006.01)
*C04B 41/87* (2006.01)
(Continued)

(52) U.S. Cl.
CPC ........ *C04B 41/5096* (2013.01); *C04B 41/009* (2013.01); *C04B 41/507* (2013.01); *C04B 41/5024* (2013.01); *C04B 41/5045* (2013.01); *C04B 41/5057* (2013.01); *C04B 41/5061* (2013.01); *C04B 41/5062* (2013.01);
(Continued)

(58) Field of Classification Search
CPC .............. C04B 41/5096; C04B 41/009; C04B 41/5024; C04B 41/5045; C04B 41/5057; C04B 41/5061; C04B 41/5062; C04B 41/5068; C04B 41/507; C04B 41/52; C04B 41/522; C04B 41/87; C04B 41/89; C23C 4/134; C23C 16/26; C23C 28/042;
(Continued)

(56) References Cited

U.S. PATENT DOCUMENTS 3,942,293 A 3/1976 Cook
3,962,059 A 6/1976 Kaup et al.
(Continued)

FOREIGN PATENT DOCUMENTS

CN 103724055 A 4/2014
EP 0845547 A1 * 6/1998 ............. C23C 28/00
(Continued)

OTHER PUBLICATIONS

Response to Search Opinion dated May 2, 2016, from counterpart European Application No. 15195819.6, filed Nov. 9, 2016, 5 pp.
(Continued)

*Primary Examiner* — Jonathan C Langman
(74) *Attorney, Agent, or Firm* — Shumaker & Sieffert, P.A.

(57) ABSTRACT

In some examples, an article may include a substrate and a coating on the substrate. In accordance with some of these examples, the coating may include a bond layer and an overlying layer comprising at least one oxide. In some examples, the bond layer comprises silicon metal and at least one of a transition metal carbide, a transition metal boride, or a transition metal nitride.

20 Claims, 2 Drawing Sheets

(51) Int. Cl.
*C04B 41/00* (2006.01)
*C04B 41/89* (2006.01)
*C04B 41/52* (2006.01)
*C23C 16/26* (2006.01)
*F01D 5/28* (2006.01)
*C23C 28/04* (2006.01)
*C23C 4/134* (2016.01)

(52) U.S. Cl.
CPC .......... *C04B 41/5068* (2013.01); *C04B 41/52* (2013.01); *C04B 41/522* (2013.01); *C04B 41/87* (2013.01); *C04B 41/89* (2013.01); *C23C 4/134* (2016.01); *C23C 16/26* (2013.01); *C23C 28/042* (2013.01); *F01D 5/288* (2013.01); *F05D 2230/31* (2013.01); *F05D 2300/222* (2013.01); *F05D 2300/226* (2013.01); *F05D 2300/228* (2013.01)

(58) Field of Classification Search
CPC ................ F01D 5/288; F05D 2230/31; F05D 2300/222; F05D 2300/226; F05D 2300/228
See application file for complete search history.

(56) References Cited

U.S. PATENT DOCUMENTS

| | | | |
|---|---|---|---|
| 4,094,673 A | 6/1978 | Erickson et al. | |
| 4,386,968 A | 6/1983 | Hinkel et al. | |
| 4,515,860 A | 5/1985 | Holzl | |
| 4,588,607 A | 5/1986 | Matarese et al. | |
| 4,914,794 A | 4/1990 | Strangman | |
| 4,996,117 A | 2/1991 | Chu et al. | |
| 5,316,851 A | 5/1994 | Brun et al. | |
| 5,320,909 A | 6/1994 | Scharman et al. | |
| 5,350,599 A | 6/1994 | Rigney et al. | |
| 5,391,404 A | 2/1995 | Lee et al. | |
| 5,435,889 A | 7/1995 | Dietrich | |
| 5,660,885 A | 8/1997 | Hasz et al. | |
| 5,704,759 A | 1/1998 | Draskovich et al. | |
| 5,714,202 A | 2/1998 | Lemelson et al. | |
| 5,773,141 A | 6/1998 | Hasz et al. | |
| 5,851,678 A | 12/1998 | Hasz et al. | |
| 5,869,146 A | 2/1999 | Mccluskey et al. | |
| 5,871,820 A | 2/1999 | Hasz et al. | |
| 5,914,189 A | 6/1999 | Hasz et al. | |
| 6,057,047 A | 5/2000 | Maloney | |
| 6,261,643 B1 | 7/2001 | Hasz et al. | |
| 6,296,942 B1 * | 10/2001 | Eaton, Jr. ............ | C04B 41/009 428/446 |
| 6,299,988 B1 | 10/2001 | Wang et al. | |
| 6,312,763 B1 | 11/2001 | Eaton, Jr. et al. | |
| 6,410,148 B1 | 6/2002 | Eaton, Jr. et al. | |
| 6,465,090 B1 | 10/2002 | Stowell et al. | |
| 6,468,648 B1 | 10/2002 | Mccluskey et al. | |
| 6,485,848 B1 | 11/2002 | Wang et al. | |
| 6,517,960 B1 | 2/2003 | Wang | |
| 6,562,409 B2 | 5/2003 | Koshkarian et al. | |
| 6,627,323 B2 | 9/2003 | Nagaraj et al. | |
| 6,720,038 B2 | 4/2004 | Darolia et al. | |
| 6,723,674 B2 | 4/2004 | Wang et al. | |
| 6,733,908 B1 | 5/2004 | Lee et al. | |
| 6,759,151 B1 | 7/2004 | Lee | |
| 6,787,195 B2 | 9/2004 | Wang et al. | |
| 6,812,176 B1 | 11/2004 | Zhu et al. | |
| 6,835,465 B2 | 12/2004 | Allen et al. | |
| 6,887,528 B2 | 5/2005 | Lau et al. | |
| 6,887,595 B1 | 5/2005 | Darolia et al. | |
| 6,890,668 B2 | 5/2005 | Bruce et al. | |
| 6,893,750 B2 | 5/2005 | Nagaraj et al. | |
| 6,902,662 B2 | 6/2005 | Eaton et al. | |
| 6,902,836 B2 | 6/2005 | Eaton et al. | |
| 6,933,061 B2 | 8/2005 | Nagaraj et al. | |
| 6,933,066 B2 | 8/2005 | Nagaraj et al. | |
| 7,008,674 B2 | 3/2006 | Nagaraj et al. | |
| 7,056,574 B2 | 6/2006 | Ojard et al. | |
| 7,063,894 B2 | 6/2006 | Sun et al. | |
| 7,090,894 B2 | 8/2006 | Carper et al. | |
| 7,186,466 B2 | 3/2007 | Zhu et al. | |
| 7,226,688 B2 | 6/2007 | Fujii et al. | |
| 7,354,651 B2 | 4/2008 | Hazel et al. | |
| 7,374,818 B2 | 5/2008 | Bhatia et al. | |
| 7,374,825 B2 | 5/2008 | Hazel et al. | |
| 7,595,114 B2 | 9/2009 | Meschter et al. | |
| 7,666,512 B2 | 2/2010 | Bhatia et al. | |
| 7,695,830 B2 | 4/2010 | Strangman et al. | |
| 7,968,217 B2 | 6/2011 | Sarrafi-nour et al. | |
| 2002/0098391 A1 | 7/2002 | Tanaka et al. | |
| 2003/0113553 A1 | 6/2003 | Sun et al. | |
| 2003/0113559 A1 | 6/2003 | Eaton et al. | |
| 2003/0138658 A1 | 7/2003 | Taylor et al. | |
| 2004/0038085 A1 | 2/2004 | Litton et al. | |
| 2004/0115351 A1 | 6/2004 | Lau et al. | |
| 2004/0151840 A1 | 8/2004 | Wang et al. | |
| 2004/0170849 A1 | 9/2004 | Ackerman et al. | |
| 2004/0234783 A1 | 11/2004 | Eaton et al. | |
| 2005/0003172 A1 | 1/2005 | Wheeler et al. | |
| 2005/0129511 A1 | 6/2005 | Allen | |
| 2005/0129973 A1 | 6/2005 | Eaton et al. | |
| 2005/0164027 A1 | 7/2005 | Lau et al. | |
| 2005/0255648 A1 | 11/2005 | Bhatia et al. | |
| 2006/0014029 A1 | 1/2006 | Saak et al. | |
| 2006/0024513 A1 | 2/2006 | Schlichting et al. | |
| 2006/0024527 A1 | 2/2006 | Schlichting et al. | |
| 2006/0073361 A1 | 4/2006 | Fukudome et al. | |
| 2006/0078750 A1 | 4/2006 | Zhu et al. | |
| 2006/0110609 A1 | 5/2006 | Eaton et al. | |
| 2006/0115661 A1 | 6/2006 | Hazel et al. | |
| 2006/0154093 A1 | 7/2006 | Meschter et al. | |
| 2006/0166018 A1 | 7/2006 | Spitsberg et al. | |
| 2006/0210800 A1 | 9/2006 | Spitsberg et al. | |
| 2006/0280952 A1 | 12/2006 | Hazel et al. | |
| 2006/0280953 A1 | 12/2006 | Hazel et al. | |
| 2006/0280954 A1 | 12/2006 | Spitsberg et al. | |
| 2006/0280955 A1 | 12/2006 | Spitsberg et al. | |
| 2006/0280963 A1 | 12/2006 | Hazel et al. | |
| 2007/0014996 A1 | 1/2007 | Bhatia et al. | |
| 2007/0082131 A1 | 4/2007 | Doesburg et al. | |
| 2007/0119713 A1 | 5/2007 | Hasz | |
| 2007/0141367 A1 | 6/2007 | Darolia et al. | |
| 2007/0184204 A1 | 8/2007 | Balagopal et al. | |
| 2008/0124479 A1 | 5/2008 | Hazel et al. | |
| 2008/0145674 A1 | 6/2008 | Darolia et al. | |
| 2008/0187767 A1 | 8/2008 | Tang et al. | |
| 2008/0274336 A1 | 11/2008 | Merrill et al. | |
| 2008/0292798 A1 | 11/2008 | Huh et al. | |
| 2009/0102008 A1 | 4/2009 | Kakehata | |
| 2009/0162556 A1 | 6/2009 | Boutwell et al. | |
| 2009/0169914 A1 | 7/2009 | Fu et al. | |
| 2009/0176059 A1 | 7/2009 | Namba et al. | |
| 2009/0184280 A1 | 7/2009 | Lee | |
| 2009/0186237 A1 | 7/2009 | Lee | |
| 2010/0015396 A1 | 1/2010 | Johnson et al. | |
| 2010/0080984 A1 | 4/2010 | Lee | |
| 2010/0129636 A1 | 5/2010 | Cybulsky et al. | |
| 2010/0136349 A1 | 6/2010 | Lee | |
| 2010/0159253 A1 | 6/2010 | Kirby et al. | |
| 2010/0272953 A1 | 10/2010 | Yankowich et al. | |
| 2011/0033630 A1 | 2/2011 | Naik | |
| 2013/0224457 A1 | 8/2013 | Lee | |
| 2014/0072816 A1 | 3/2014 | Lee | |
| 2014/0162027 A1 | 6/2014 | Meschter et al. | |

FOREIGN PATENT DOCUMENTS

| | | |
|---|---|---|
| EP | 1400611 A1 | 3/2004 |
| EP | 1479661 A2 | 11/2004 |
| EP | 1626039 A1 | 2/2006 |
| EP | 1666638 A1 | 6/2006 |
| EP | 1806435 A2 | 7/2007 |
| EP | 1829847 A2 | 9/2007 |
| EP | 1925694 A2 | 5/2008 |
| EP | 1975258 A1 | 10/2008 |

(56) References Cited

FOREIGN PATENT DOCUMENTS

| EP | 2108715 | A2 | 10/2009 |
|---|---|---|---|
| EP | 2189504 | A1 | 5/2010 |
| EP | 2192098 | A2 | 6/2010 |
| EP | 2194164 | A1 | 6/2010 |
| EP | 2208805 | A1 | 7/2010 |
| EP | 1925694 | A3 | 2/2011 |
| EP | 2287131 | A2 | 2/2011 |
| EP | 2287138 | A2 | 2/2011 |
| GB | 2319248 | A | 5/1998 |
| WO | 2000064836 | A1 | 11/2000 |
| WO | 2006/023894 | A2 | 3/2006 |
| WO | 2007098152 | A2 | 8/2007 |
| WO | 2008/103163 | A2 | 8/2008 |
| WO | 2008/109214 | A2 | 9/2008 |
| WO | 2009/091721 | A2 | 7/2009 |
| WO | 2010/039699 | A3 | 4/2010 |

OTHER PUBLICATIONS

Intent to Grant dated May 14, 2018, from counterpart European Application No. 15195819.6, 26 pp.

Extended European Search Report from counterpart European Application No. 15195819.6, dated May 2, 2016, 8 pp.

Manning et al., "Thermal Expansion of Nb2O5," Journal of the American Society, vol. 55, Issue 7, Jul. 1972, pp. 342-347.

Search Report from counterpart Singaporean Application No. 10201509617P, dated Jul. 10, 2018, 7 pp.

Kato et al., "Improvement of High-Temperature Endurance of C/C Composites by Double Coating with SiC and Glass Materials," Journal of Chemical Engineering of Japan, vol. 29, No. 4, Feb. 16, 1996, 6 pp.

Lee et al., "Development and environmental durability of mullite and mullite/YSZ dual layer coatings for SiC and Si3N4 ceramics," Surface and Coatings Technology, vol. 86-87, Elsevier B.V., Dec. 1, 1996, pp. 142-148.

Lee et al., "Rare earth silicate environmental barrier coatings for Si/C/SiC composites and Si3N4 ceramics," Journal of the European Ceramic Society 25, pp. 1705-1715, Jun. 2005.

Shelby et al., "Rare earth aluminosilicate glasses," Journal of American Ceramic Society, vol. 73, No. 1, Jan. 1990, pp. 39-42.

Response to Singaporean Search Report and Written Opinion dated Jul. 10, 2018, from counterpart Singaporean Application No. 10201509617P, filed Nov. 13, 2018, 12 pp.

\* cited by examiner

BOND LAYER FOR SILICON-CONTAINING SUBSTRATES

This application claims the benefit of U.S. Provisional Patent Application No. 62/083,742, filed Nov. 24, 2014, and titled, "BOND LAYER FOR SILICON-CONTAINING SUBSTRATES." The entire content of U.S. Provisional Patent Application No. 62/083,742 is incorporated herein by reference.

TECHNICAL FIELD

The disclosure relates to coatings for superalloy substrates, ceramic substrates, or ceramic matrix composite substrates.

BACKGROUND

Components of high-temperature mechanical systems, such as, for example, gas-turbine engines, operate in severe environments. For example, the high-pressure turbine blades, vanes, blade tracks and blade shrouds exposed to hot gases in commercial aeronautical engines may experience metal surface temperatures of about 1000° C., with short-term peaks as high as 1100° C.

Components of high-temperature mechanical systems may include a Ni- or Co-based superalloy substrate, a ceramic substrate, or a ceramic matrix composite (CMC) substrate. Some ceramics or CMCs possess excellent high temperature mechanical, physical and chemical properties, and may allow gas turbine engines to operate at higher temperatures than gas turbine engines having superalloy components.

SUMMARY

The disclosure describes an article including a substrate and a coating that includes a bond layer comprising silicon metal (e.g., free silicon) and at least one of a transition metal carbide, a transition metal boride, or a transition metal nitride. The coating also may include an overlying layer including at least one oxide. Transition metal carbides, transition metal borides, and transition metal carbides may have a different coefficient of thermal expansion than silicon metal. For example, transition metal carbides and transition metal borides may have CTEs between about 5 parts per million per degree Celsius (ppm/° C.) and about 8 ppm/° C., and transition metal nitrides may have CTEs of about 9 ppm/° C. By mixing silicon metal and at least one of a transition metal carbide, a transition metal boride, or a transition metal nitride, the CTE of the bond layer may be increased to more closely match the CTE of the substrate, the CTE of the overlying layer, or both.

In some examples, an article may include a substrate and a coating on the substrate. In accordance with some of these examples, the coating may include a bond layer and an overlying layer comprising at least one oxide. In some examples, the bond layer includes silicon metal and at least one of a transition metal carbide, a transition metal boride, or a transition metal nitride.

In some examples, a method may include forming a bond layer including silicon metal and at least one of a transition metal carbide, a transition metal boride, or a transition metal nitride on a substrate and forming an overlying layer comprising an oxide on the bond layer.

The details of one or more examples are set forth in the accompanying drawings and the description below. Other features, objects, and advantages will be apparent from the description and drawings, and from the claims.

DETAILED DESCRIPTION

Figure 1:
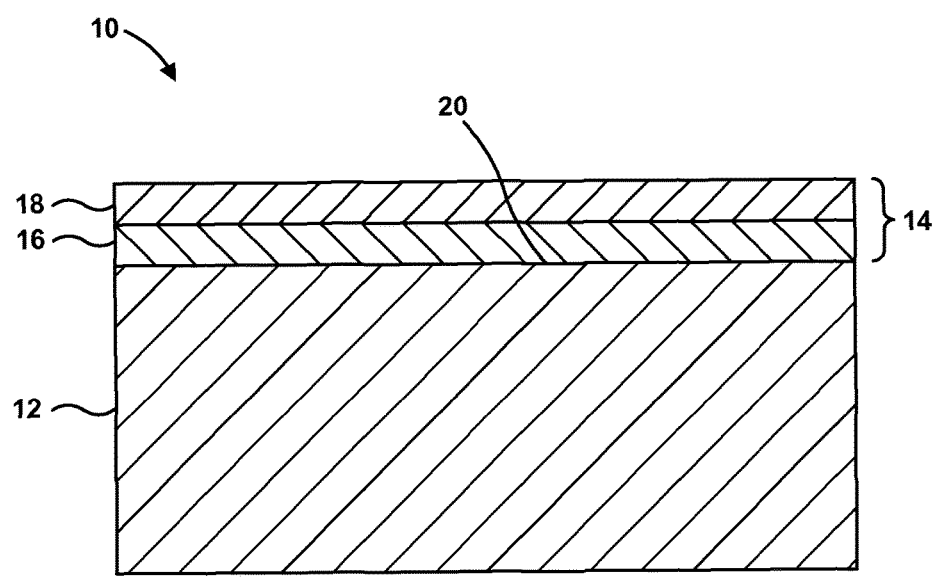
FIG. 1 is a conceptual and schematic diagram illustrating an example article including a substrate and a coating, which includes a bond layer and an overlying layer.

The disclosure describes an article including a substrate and a coating that includes a bond layer including silicon metal (e.g., free silicon) and at least one of a transition metal carbide, a transition metal boride, or a transition metal nitride. The coating also may include an overlying layer including at least one oxide. In some examples, ceramic or ceramic matrix composite (CMC) substrates may include silicon metal or a silicon-containing material, such as silicon carbide or silicon nitride. Substrates including silicon metal or a silicon-containing material may be vulnerable to chemical attack by species present in the cooling fluid, including impurities. For example, water vapor may chemically attack a ceramic or CMC substrate including silicon to form silicon hydroxide species at the temperatures experienced by the ceramic or CMC substrate and damage the ceramic or CMC substrate.

To reduce or substantially prevent damage to the ceramic or CMC substrate, the ceramic or CMC substrate may be coated with an environmental barrier coating (EBC), which reduces or substantially prevents recession of the CMC substrate by reaction with water vapor. In some examples, a bond layer is provided between the substrate and the EBC and may enhance adherence of the EBC to the substrate. Because the EBC may be permeable to some gaseous species (e.g., oxygen), the bond layer may include a material that forms a relatively stable oxide, such as silicon metal. To reduce stresses caused by differential thermal expansion and contraction during temperature changes, the ceramic or CMC substrate, the bond layer, and the EBC may have relatively similar coefficients of thermal expansion (CTE).

Silicon oxidizes to a stable silicon oxide and has a CTE that is relatively close to that of some EBCs (e.g., EBCs that include rare earth disilicate). The CTEs of silicon metal and rare earth disilicate are about 4 ppm/° C. However, some CMCs may have a CTE different than that of silicon metal. For example, SiC—SiC CMCs may have a CTE of between about 4.3 ppm/° C. and about 5.5 ppm/° C. Similarly, EBCs that include rare earth monosilicates may have a CTE greater than about 6.0 ppm/° C. The difference in CTEs between the substrate and silicon metal and the EBC and silicon metal may lead to increased stress at the interfaces, which may lead to mechanical failure of the coating.

Transition metal carbides, transition metal borides, and transition metal nitrides may have a different CTE than silicon metal. For example, transition metal carbides and transition metal borides may have CTEs between about 5 ppm/° C. and about 8 ppm/° C., and transition metal nitrides may have CTEs of about 9 ppm/° C. By mixing silicon metal and at least one of a transition metal carbide, a transition metal boride, or a transition metal nitride, the CTE of the bond layer may be increased to more closely match the CTE of the substrate, the CTE of the overlying layer, or both. This may reduce stress at the interfaces between the substrate and the bond layer, between the bond layer and the overlying layer, or both, during thermal cycling of the article. In some examples, the addition of the transition metal carbide, the transition metal boride, the transition metal nitride, or combinations thereof may result in formation of a second phase within the bond layer, which may improve creep strength of the bond layer compared to a bond layer including a single phase.

Additionally or alternatively, the addition of the transition metal carbide, the transition metal boride, the transition metal nitride, or combinations thereof may improve oxidation resistant of the bond layer compared to a bond layer including only silicon metal. For example, the at least one of the transition metal carbide, the transition metal boride, or the transition metal nitride may be incorporated into the thermally grown silicon oxide, which may improve adherence of the thermally grown silicon oxide to the bond layer, decrease oxygen diffusivity through the thermally grown silicon oxide (which reduces the rate of oxidation of the remaining bond layer), or both.

FIG. 1 is a conceptual and schematic diagram illustrating an example article 10 including a substrate 12 and a coating 14, which includes a bond layer 16 and an overlying layer 18. Bond layer 16 may include a mixture of silicon metal and at least one of a transition metal carbide, a transition metal boride, or a transition metal nitride.

Substrate 12 may be a component of a high temperature mechanical system. For example, substrate 12 may be a blade track, an airfoil, a blade, a combustion chamber liner, or the like. In some examples, substrate 12 include a ceramic, a ceramic matrix composite (CMC), or a metal alloy that includes Si. In some examples, substrate 12 may include a silicon based material, such as silicon based ceramic, a silicon based CMC, or a silicon based alloy.

In some examples in which substrate 12 includes a ceramic, the ceramic may be substantially homogeneous. In some examples, a substrate 12 that includes a ceramic includes, for example, a Si-containing ceramic, such as $SiO_2$, silicon carbide (SiC) or silicon nitride ($Si_3N_4$); $Al_2O_3$; aluminosilicate (e.g., $Al_2SiO_5$); or the like. In other examples, substrate 10 includes a metal alloy that includes Si, such as a molybdenum-silicon alloy (e.g., $MoSi_2$) or a niobium-silicon alloy (e.g., $NbSi_2$).

In examples in which substrate 12 includes a CMC, substrate 12 includes a matrix material and a reinforcement material. The matrix material includes a ceramic material, such as, for example, SiC, $Si_3N_4$, $Al_2O_3$, aluminosilicate, $SiO_2$, or the like. The CMC further includes a continuous or discontinuous reinforcement material. For example, the reinforcement material may include discontinuous whiskers, platelets, or particulates. As other examples, the reinforcement material may include a continuous monofilament or multifilament weave. In some examples, the reinforcement material may include SiC, $Si_3N_4$, $Al_2O_3$, aluminosilicate, $SiO_2$, or the like. In some examples, substrate 12 includes a SiC—SiC ceramic matrix composite.

Substrate 12 defines a surface 20 on which coating 14 is disposed. In the example illustrated in FIG. 1, coating 14 includes a bond layer 16 and an overlying layer 18.

Overlying layer 18 may include, for example, an environmental barrier coating (EBC), a thermal barrier coating (TBC), a calcia-magnesia-aluminosilicate (CMAS)-resistant layer, or the like. In some examples, a single overlying layer 18 may perform two or more of these functions. For example, an EBC may provide environmental protection, thermal protection, and CMAS-resistance to substrate 12. In some examples, instead of including a single overlying layer 18, article 10 may include a plurality of overlying layers, such as at least one EBC layer, at least one TBC layer, at least one CMAS-resistant layer, or combinations thereof.

An EBC layer may include at least one of a rare earth oxide, a rare earth silicate, an aluminosilicate, or an alkaline earth aluminosilicate. For example, an EBC layer may include mullite, barium strontium aluminosilicate (BSAS), barium aluminosilicate (BAS), strontium aluminosilicate (SAS), at least one rare earth oxide, at least one rare earth monosilicate ($RE_2SiO_5$, where RE is a rare earth element), at least one rare earth disilicate ($RE_2Si_2O_7$, where RE is a rare earth element), or combinations thereof. The rare earth element in the at least one rare earth oxide, the at least one rare earth monosilicate, or the at least one rare earth disilicate may include at least one of Lu (lutetium), Yb (ytterbium), Tm (thulium), Er (erbium), Ho (holmium), Dy (dysprosium), Tb (terbium), Gd (gadolinium), Eu (europium), Sm (samarium), Pm (promethium), Nd (neodymium), Pr (praseodymium), Ce (cerium), La (lanthanum), Y (yttrium), or Sc (scandium). In some examples, the at least one rare earth oxide includes an oxide of at least one of Yb, Y, Gd, or Er.

In some examples, an EBC layer may include at least one rare earth oxide and alumina, at least one rare earth oxide and silica, or at least one rare earth oxide, silica, and alumina. In some examples, an EBC layer may include an additive in addition to the primary constituents of the EBC layer. For example, an EBC layer may include at least one of $TiO_2$, $Ta_2O_5$, $HfSiO_4$, an alkali metal oxide, or an alkali earth metal oxide. The additive may be added to the EBC layer to modify one or more desired properties of the EBC layer. For example, the additive components may increase or decrease the reaction rate of the EBC layer with CMAS, may modify the viscosity of the reaction product from the reaction of CMAS and the EBC layer, may increase adhesion of the EBC layer to bond layer 16, may increase or decrease the chemical stability of the EBC layer, or the like.

In some examples, the EBC layer may be substantially free (e.g., free or nearly free) of hafnia and/or zirconia. Zirconia and hafnia may be susceptible to chemical attack by CMAS, so an EBC layer substantially free of hafnia and/or zirconia may be more resistant to CMAS attack than an EBC layer that includes zirconia and/or hafnia.

In some examples, the EBC layer may have a dense microstructure, a columnar microstructure, or a combination of dense and columnar microstructures. A dense microstructure may be more effective in preventing the infiltration of CMAS and other environmental contaminants, while a columnar microstructure may be more strain tolerant during thermal cycling. A combination of dense and columnar microstructures may be more effective in preventing the infiltration of CMAS or other environmental contaminants than a fully columnar microstructure while being more strain tolerant during thermal cycling than a fully dense microstructure. In some examples, an EBC layer with a dense microstructure may have a porosity of less than about 20 vol. %, such as less than about 15 vol. %, less than 10 vol. %, or less than about 5 vol. %, where porosity is measured as a percentage of pore volume divided by total volume of the EBC layer.

In some examples, overlying layer 18 may include a TBC layer. The TBC layer may include, for example, yttriastabilized zirconia (YSZ), zirconia stabilized by a single or multiple rare earth oxides, hafnia stabilized by a single or multiple rare earth oxides, zirconia-rare earth oxide compounds, such as $RE_2Zr_2O_7$ (where RE is a rare earth element), and hafnia-rare earth oxide compounds, such as $RE_2Hf_2O_7$ (where RE is a rare earth element). As described above, the TBC layer may be used as a single overlying layer 18 or may be used in combination with at least one other layer, such as an EBC layer.

Bond layer 16 is between substrate 12 and overlying layer 18. Bond layer 16 may include silicon metal and at least one of a transition metal carbide, a transition metal boride, or a transition metal nitride. Bond layer 16 may include silicon metal and at least one transition metal carbide; silicon metal and at least one transition metal boride; silicon metal and at least one transition metal nitride; silicon metal, at least one transition metal carbide, and at least one transition metal boride; silicon metal, at least one transition metal carbide, and at least one transition metal nitride; silicon metal, at least one transition metal boride, and at least one transition metal nitride; or silicon metal, at least one transition metal carbide, at least one transition metal boride, and at least one transition metal nitride. The transition metal may include, for example, Cr, Mo, Nb, W, Ti, Ta, Hf, or Zr. The at least one transition metal carbide may include at least one of $Cr_3C_2$, $Cr_7C_3$, $Cr_{23}C_6$, $Mo_2C$, NbC, WC, TaC, HfC, or ZrC. The at least one transition metal boride may include at least one of TaB, $TaB_2$, $TiB_2$, $ZrB_2$, HfB, or $HfB_2$. The at least one transition metal nitride may include at least one of TiN, ZrN, HfN, $Mo_2N$, or TaN.

In some examples, bond layer 16 may include between about 40 volume percent (vol. %) and about 99 vol. % silicon metal and a balance of the at least one of a transition metal carbide or a transition metal boride. For example, bond layer 16 may include between 1 vol. % and about 60 vol. % of the at least one of a transition metal carbide, a transition metal boride, or a transition metal nitride, and a balance silicon metal an any additional constituents (such as silicon carbide). In some examples, bond layer 16 may include between about 1 vol. % and about 30 vol. %, or between about 5 vol. % and about 20 vol. % of the at least one of a transition metal carbide, a transition metal boride, or a transition metal nitride, and a balance silicon metal and any additional constituents (such as silicon carbide). The particular composition ranges may vary based on the CTE of the at least one of a transition metal carbide, a transition metal boride, or a transition metal nitride. Table 1 illustrates a series of example amounts of transition metal carbide and transition metal boride based on use of a single transition metal carbide or boride, a $Yb_2Si_2O_7$ EBC and a SiC/SiC composite substrate.

TABLE 1

|  | Example Upper Bound (vol. %) | Example Value (vol. %) | Example Lower Bound (vol. %) |
|---|---|---|---|
| $Mo_2C$ | 31 | 13 | 2 |
| NbC | 21 | 9 | 1 |
| TaC | 24 | 10 | 1 |
| HfC | 24 | 10 | 2 |
| ZrC | 23 | 10 | 2 |
| TaB | 18 | 7 | 1 |
| $TiB_2$ | 17 | 7 | 1 |
| $ZrB_2$ | 21 | 9 | 1 |
| TiN | 21 | 9 | 1 |
| $Mo_2N$ | 11 | 4.8 | 0.6 |
| ZrN | 22 | 9.4 | 1.3 |

At least some transition metal carbides, at least some transition metal borides, and at least some transition metal nitrides may possess a CTE higher than that of silicon metal and are refractory. For example, at least some transition metal carbides, at least some transition metal borides, and at least some transition metal nitrides have a melting point that is greater than about 2000° C. or even greater than about 3000° C.

In some examples, addition of the at least one of a transition metal carbide, a transition metal boride, or a transition metal nitride may not decrease the melting point of bond layer 16 more than about 50° C. when compared to a bond layer including substantially only silicon metal. In other words, addition of the at least one of a transition metal carbide, a transition metal boride, or a transition metal nitride may not decrease the melting point of bond layer 16 to lower than about 1354° C. (the melting point of silicon metal is about 1414° C.). Thus, addition of the at least one of a transition metal carbide, a transition metal boride, or at least one transition metal nitride to silicon metal may not substantially reduce the temperature capability of bond layer 16 compared to a bond layer including substantially only silicon metal.

Transition metal carbides, transition metal borides, and transition metal nitrides may have a different CTE than silicon metal. For example, transition metal carbides and transition metal borides may have CTEs between about 5 ppm/° C. and about 8 ppm/° C. By mixing silicon metal and a transition metal carbide, a transition metal boride, or both, the CTE of bond layer 16 may be increased to more closely match the CTE of substrate 12, the CTE of overlying layer 18, or both. This may reduce stress at the interfaces between substrate 12 and bond layer 16, between bond layer 16 and overlying layer 18, or both, during thermal cycling of article 10.

Transition metal carbides and transition metal borides may have CTE's between about 5 ppm/° C. and about 8 ppm/° C., and transition metal nitrides may have CTEs of about 9 ppm/° C. As a comparison, silicides and some oxides have CTEs that are higher, such as between about 9 ppm/° C. and about 13 ppm/° C. Because transition metal carbides and transition metal borides may have a lower CTE than some silicides or oxides, a bond layer 16 having a selected CTE may include a greater concentration of transition metal carbides or transition metal borides than a bond layer having the same CTE and a silicide additive. In some examples, bond layer 16 may include between about 1 volume percent and about 90 volume percent of the at least one of a transition metal boride, a transition metal carbide, or a transition metal nitride. A higher concentration of the at least one of a transition metal boride, a transition metal carbide, or a transition metal nitride may allow greater modification of properties (e.g., reactivity, incorporation of the at least one of a transition metal boride, a transition metal carbide, or a transition metal nitride into a thermal oxide layer formed on a surface of bond layer 16, or the like) of bond layer 16.

Additionally or alternatively, the addition of the at least one of the transition metal carbide, the transition metal boride, or the transition metal nitride may improve oxidation resistant of bond layer 16 compared to a bond layer including only silicon metal. For example, the at least one of the transition metal carbide, the transition metal boride, or the transition metal nitride may be incorporated into the thermally grown silicon oxide, which may improve adherence of the thermally grown silicon oxide to the bond layer, decrease oxygen diffusivity through the thermally grown silicon oxide (which reduces the rate of oxidation of the remaining bond layer), or both.

In some examples, the addition of the at least one of the transition metal carbide, the transition metal boride, or the transition metal nitride may result in formation of a second phase within bond layer 16 (in addition to a first phase including silicon metal). In some examples, the first phase including silicon metal may be a substantially continuous phase. In some examples, the second phase including the at least one of the transition metal carbide, the transition metal boride, or the transition metal nitride may include a discrete phase within the substantially continuous first phase. A bond layer 16 including a first phase and a second phase may possess improved creep strength compared to some bond layers including a single phase.

In some examples, bond layer 16 includes silicon metal and at least one transition metal carbide, and the at least one transition metal carbide may be carbon deficient. In other words, the at least one transition metal carbide may include less carbon that the stoichiometric ratio. This may increase the reactivity of the transition metal carbide with silicon metal. In some examples, the transition metal carbide may react with silicon metal to form a ternary carbide including the transition metal, silicon metal, and carbon.

Figure 2:
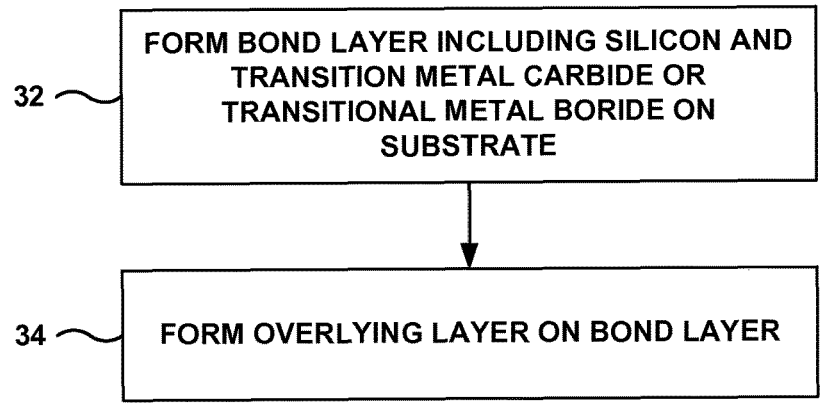
FIG. 2 is a flow diagram illustrating an example technique for forming article including a bond layer, which includes silicon metal and at least one of a transition metal carbide, a transition metal boride, or a transition metal nitride, and an overlying layer on the bond layer.

Article 10 may be formed using one or more technique, such as slurry deposition, plasma spraying, physical vapor deposition (PVD), or chemical vapor deposition (CVD). FIG. 2 is a flow diagram illustrating an example technique for forming article 10 including bond layer 16, which includes silicon metal and at least one of a transition metal carbide and a transition metal boride. The technique of FIG. 2 will be described with concurrent reference to article 10 of FIG. 1, although the technique of FIG. 2 may be used to form different articles, and article 10 of FIG. 1 may be formed using a different technique.

Figure 3:
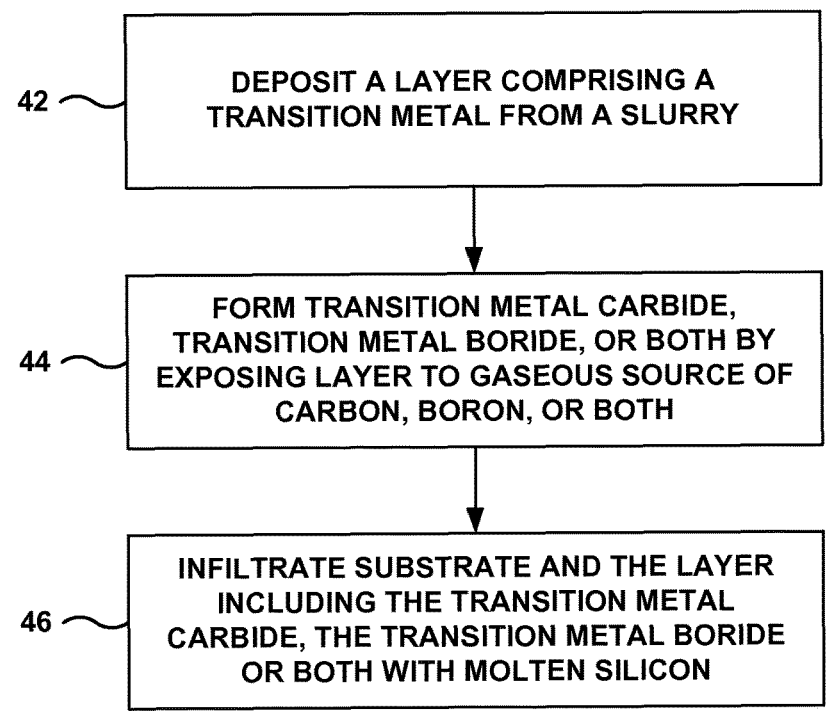
FIG. 3 is a flow diagram illustrating an example technique for forming bond layer using a slurry based processing technique followed by silicon melt infiltration.

The technique of FIG. 2 includes forming bond layer 16 on surface 20 of substrate 12 (32). In some examples, bond layer 16 may be deposited on surface 20 of substrate using plasma spraying, PVD, or CVD. In other examples, bond layer 16 may be formed on surface of substrate 12 (32) using a slurry-based colloidal processing technique followed by silicon melt infiltration. FIG. 3 is a flow diagram illustrating an example technique for forming bond layer 16 using a slurry-based colloidal processing technique followed by silicon melt infiltration.

The technique of FIG. 3 may include depositing a layer comprising a transition metal using a slurry based processing technique (42). In some examples, the slurry based processing technique may include tape casting. In tape casting, a slurry including the transition metal may be formed. The slurry may include a solvent (e.g., water, ethanol, isopropyl alcohol, methyl ethyl ketone, toluene, or the like) and transition metal particles. In some examples, the slurry additionally may include a binder (e.g. polyethylene glycol, acrylate co-polymers, latex co-polymers, polyvinyl pyrrolidone co-polymers, polyvinyl butyral, or the like), a dispersant (e.g., ammonium polyacrylate, polyvinyl butyral, a phosphate ester, polyethylene imine, BYK® 110 (available from Byk USA, Inc., Wallingford Conn.), or the like), or the like. The slurry then may be formed into a layer (a tape) on a liner and at least partially dried to remove at least some of the solvent. The resulting tape includes the transition metal and may be applied to a ceramic matrix composite or a ceramic matrix composite preform as part of forming bond layer 16 on surface 20 of substrate 12 (32).

In other examples, forming bond layer 16 on surface 20 of substrate 12 (32) may include depositing the transition metal from a slurry including a solvent and transition metal particles. In some examples, the slurry additionally may include a binder, a dispersant, or the like. The slurry may be applied on surface 20 of substrate 12 using, for example, spray coating, spin coating, dip coating, brushing, or the like.

In some examples, the slurry deposited on surface 20 of substrate 12 or used to form the tape may additionally include silicon carbide particles. The silicon carbide particles may affect the properties of bond layer 16. For example, the silicon carbide particles may modify oxidation resistance of bond layer 16, modify chemical resistance of bond layer 16, influence the CTE of bond layer 16, improve silicon melt infiltration into bond layer 16, or the like. In some examples, the slurry may include sufficient silicon carbide particles so that bond layer 16 includes between about 1 vol. % and about 40 vol. % silicon carbide, such as between about 1 vol. % and about 20 vol. % silicon carbide, or between about 5 vol. % and about 40 vol. % silicon carbide, or between about 5 vol. % and about 20 vol. % silicon carbide.

The size of the transition metal particles may be selected at least partially based on the size of particles that facilitate the subsequent reaction with a carbon or boron source to form the transition metal carbide, transition metal boride, or both. For example, larger transition metal particles may increase the time needed to substantially fully (e.g., fully or nearly fully) react the transition metal particles with the carbon or boron source to form the transition metal carbide, transition metal boride, or both throughout substantially the full volume of the particles. Conversely, small transition metal particles may decrease the time needed to substantially fully (e.g., fully or nearly fully) react the transition metal particles with the carbon or boron source to form the transition metal carbide, transition metal boride, or both throughout substantially the full volume of the particles. In some examples, the transition metal particles may have a diameter between 1 μm and 20 μm, such as between about 1 μm and about 10 μm.

Regardless of whether the transition metal is applied to surface 20 using tape casting, slurry deposition, or another slurry-based colloidal processing technique, in some examples, the transition metal may be applied to a surface of a ceramic matrix composite preform. For example, a ceramic matrix composite preform may include a fibrous reinforcement infiltrated with a slurry including one or more constituents of the matrix material of the ceramic matrix composite. In some examples, the fibrous reinforcement may include silicon carbide (SiC) fibers and the slurry may include silicon carbide particles or a carbon source. The slurry may be infiltrated throughout pores defined between the fibrous reinforcement material, and may be dried or reacted to form a gel, which may help retain the one or more constituents of the matrix material within the ceramic matrix composite preform.

The technique of FIG. 3 also may include forming at least one of a transition metal carbide, a transition metal boride, or a transition metal nitride by exposing the layer including the transition metal to a gaseous source of at least one of carbon, boron, or nitrogen (44). For example, to form a transition metal carbide, the layer including the transition metal may be heated and exposed to a gas including a carbon source, such as methane, carbon monoxide, or the like. The layer including the transition metal may be heated and exposed to the gas including the carbon source for a time sufficient to result in formation of transition metal carbide substantially throughout the transition metal particles and the layer.

Similarly, to form a transition metal boride, the layer including the transition metal may be heated and exposed to a gas including a boron source, such as gaseous boron trichloride, or the like. To form a transition metal nitride, the layer including the transition metal may be heated and exposed to a gas including a nitrogen source, such as nitrogen, gaseous ammonia, or the like. The layer including the transition metal may be heated and exposed to the gas including the boron source or the nitrogen source for a time sufficient to result in formation of transition metal boride or transition metal nitride substantially throughout the transition metal particles and the layer. By forming the at least one of the transition metal carbide, the transition metal boride, or the transition metal nitride on the surface of the article by exposing a layer including a transition metal to at least one of a gaseous carbon source, a gaseous boron source, or a gaseous nitrogen source, in some examples, the resulting at least one of a transition metal carbide, a transition metal boride, or a transition metal nitride may be substantially pure (e.g., pure or nearly pure).

After formation of at least one of a transition metal carbide, a transition metal boride, or a transition metal nitride, the technique of FIG. 3 further includes infiltrating the porous substrate precursor and the porous layer including the at least one of the transition metal carbide, the transition metal boride, or the transition metal nitride with molten silicon metal or molten silicon alloy(46).

In other examples, rather than applying the transition metal in a layer from a slurry, borodizing, nitridizing, or carbonizing the transition metal, and melt infiltrating the layer with silicon metal, bond layer 16 may be formed by depositing the transition metal carbide, boride, or nitride and silicon metal from a slurry. The slurry may include particles of silicon metal or a silicon alloy and particles of at least one transition metal carbide, boride, or nitride. In some examples, the slurry additionally may include a binder, a dispersant, or the like, such as any of those described above. The slurry may be applied on surface 20 of substrate 12 using, for example, spray coating, spin coating, dip coating, brushing, or the like. The slurry then may be dried to remove excess solvent and sintered to form bond layer 16.

Returning to FIG. 2, the technique may additionally include forming overlying layer 18 on bond layer 16 (34). As described above, overlying layer 18 may include, for example, an EBC, CMAS-resistant layer, or the like. Overlying layer 18 may be formed using, for example, a thermal spraying technique, such as plasma spraying, CVD, PVD, electron beam PVD (EB-PVD), directed vapor deposition (DVD), a slurry-based coating technique, or the like.

Various examples have been described. These and other examples are within the scope of the following claims.

The invention claimed is:
1. An article comprising:
 a substrate; and
 a coating on the substrate, wherein the coating comprises a bond layer and an overlying layer comprising at least one oxide, wherein the bond layer comprises between 40 volume percent and 99 volume percent silicon metal and a balance of at least one of a transition metal carbide, a transition metal boride, or a transition metal nitride.
2. The article of claim 1, wherein the bond layer comprises silicon metal and at least one transition metal carbide, and wherein the at least one transition metal carbide comprises at least one of $Cr_3C_2$, $Cr_7C_3$, $Cr_{23}C_6$, $Mo_2C$, NbC, WC, TaC, HfC, or ZrC.
3. The article of claim 1, wherein the bond layer comprises silicon metal and at least one transition metal boride, and wherein the at least one transition metal boride comprises at least one of TaB, $TaB_2$, $TiB_2$, $ZrB_2$, HfB, $HfB_2$.
4. The article of claim 1, wherein the bond layer comprises silicon metal and at least one transition metal nitride, and wherein the at least one transition metal nitride comprises at least one of TiN, ZrN, HfN, $Mo_2N$, or TaN.
5. The article of claim 1, wherein the bond layer comprises silicon metal, at least one transition metal carbide, and at least one transition metal boride, wherein the at least one transition metal carbide comprises at least one of $Cr_3C_2$, $Cr_7C_3$, $Cr_{23}C_6$, $Mo_2C$, NbC, WC, TaC, HfC, or ZrC, and wherein the at least one transition metal boride comprises at least one of TaB, $TaB_2$, $TiB_2$, $ZrB_2$, HfB, $HfB_2$.
6. The article of claim 1, wherein the bond layer comprises silicon metal, at least one transition metal carbide, and at least one transition metal nitride, wherein the at least one transition metal carbide comprises at least one of $Cr_3C_2$, $Cr_7C_3$, $Cr_{23}C_6$, $Mo_2C$, NbC, WC, TaC, HfC, or ZrC, and wherein the at least one transition metal nitride comprises at least one of TiN, ZrN, HfN, $Mo_2N$, or TaN.
7. The article of claim 1, wherein the bond layer comprises silicon metal, at least one transition metal boride, and at least one transition metal nitride, wherein the at least one transition metal boride comprises at least one of TaB, $TaB_2$, $TiB_2$, $ZrB_2$, HfB, $HfB_2$, and wherein the at least one transition metal nitride comprises at least one of TiN, ZrN, HfN, $Mo_2N$, or TaN.
8. The article of claim 1, wherein the bond layer comprises silicon metal, at least one transition metal carbide, at least one transition metal boride, and at least one transition metal nitride, wherein the at least one transition metal carbide comprises at least one of $Cr_3C_2$, $Cr_7C_3$, $Cr_{23}C_6$, $Mo_2C$, NbC, WC, TaC, HfC, or ZrC, wherein the at least one transition metal boride comprises at least one of TaB, $TaB_2$, $TiB_2$, $ZrB_2$, HfB, $HfB_2$, and wherein the at least one transition metal nitride comprises at least one of TiN, ZrN, HfN, $Mo_2N$, or TaN.
9. The article of claim 1, wherein the bond layer comprises a first phase comprising silicon metal and a second phase comprising the at least one of a transition metal carbide, a transition metal boride, or a transition metal nitride.
10. The article of claim 9, wherein the first phase is a substantially continuous phase.
11. The article of claim 1, wherein the overlying layer comprising at least one oxide comprises at least one of a rare earth oxide, a rare earth silicate, or an alkaline earth aluminosilicate.
12. The article of claim 1, wherein the substrate comprises a silicon-based substrate.
13. The article of claim 12, wherein the substrate comprises silicon carbide.
14. The article of claim 13, wherein the substrate comprises a silicon carbide-silicon carbide ceramic matrix composite.
15. The article of claim 1, wherein the bond layer comprises a single layer between the substrate and the overlying layer.
16. A method comprising:
 forming a bond layer comprising silicon metal between 40 volume percent and 99 volume percent and a balance of at least one of a transition metal carbide, a transition metal boride, or a transition metal nitride on a substrate; and forming an overlying layer comprising an oxide on the bond layer.

17. The method of claim 16, wherein the bond layer comprises silicon metal and the transition metal carbide, and wherein forming the bond layer comprises:
depositing a layer comprising a transition metal from a slurry on a bulk surface of a porous substrate preform;
forming the transition metal carbide by exposing the layer including the transition metal to a carbon-containing gas to form a porous layer including the transition metal carbide; and
infiltrating the porous substrate preform and the porous layer including the transition metal carbide with molten silicon to form an article including a ceramic matrix composite substrate and the bond layer comprising silicon metal and the transition metal carbide.

18. The method of claim 17, wherein:
the transition metal comprises at least one of Cr, Mo, Nb, W, Ti, Ta, Hf, or Zr;
the carbon-containing gas comprises at least one of methane or carbon monoxide; and
the transition metal carbide comprises at least one of $Cr_3C_2$, $Cr_7C_3$, $Cr_{23}C_6$, $Mo_2C$, NbC, WC, TiC, TaC, HfC, and ZrC.

19. The method of claim 16, wherein the bond layer comprises silicon metal and the transition metal boride, and wherein forming the bond layer comprises:
depositing a layer comprising a transition metal from a slurry on a bulk surface of a porous substrate preform;
forming the transition metal boride by exposing the layer including the transition metal to a boron-containing gas to form a porous layer including the transition metal boride; and
infiltrating the porous substrate preform and the porous layer including the transition metal boride with molten silicon metal to form an article including a ceramic matrix composite substrate and the bond layer comprising silicon metal and the transition metal boride.

20. The method of claim 16, wherein the bond layer comprises silicon metal and the transition metal nitride, and wherein forming the bond layer comprises:
depositing a layer comprising a transition metal from a slurry on a bulk surface of a porous substrate preform;
forming the transition metal nitride by exposing the layer including the transition metal to a nitrogen-containing gas to form a porous layer including the transition metal nitride; and
infiltrating the porous substrate preform and the porous layer including the transition metal nitride with molten silicon metal to form an article including a ceramic matrix composite substrate and the bond layer comprising silicon metal and the transition metal nitride.

* * * * *